United States Patent
Toda et al.

(10) Patent No.: US 8,921,706 B2
(45) Date of Patent: Dec. 30, 2014

(54) COMPONENT-EMBEDDED SUBSTRATE, AND METHOD OF MANUFACTURING THE COMPONENT-EMBEDDED SUBSTRATE

(75) Inventors: Mitsuaki Toda, Ayase (JP); Yoshio Imamura, Ayase (JP); Takuya Hasegawa, Ayase (JP)

(73) Assignee: Meiko Electronics Co., Ltd., Kanagawa (JP)

( * ) Notice: Subject to any disclaimer, the term of this patent is extended or adjusted under 35 U.S.C. 154(b) by 140 days.

(21) Appl. No.: 13/823,700

(22) PCT Filed: Oct. 1, 2010

(86) PCT No.: PCT/JP2010/067260
§ 371 (c)(1),
(2), (4) Date: Mar. 14, 2013

(87) PCT Pub. No.: WO2012/042668
PCT Pub. Date: Apr. 5, 2012

(65) Prior Publication Data
US 2013/0176701 A1    Jul. 11, 2013

(51) Int. Cl.
*H05K 1/16* (2006.01)
*H05K 1/18* (2006.01)
*H05K 3/32* (2006.01)
*H05K 1/02* (2006.01)

(52) U.S. Cl.
CPC ............... *H05K 1/182* (2013.01); *H05K 1/188* (2013.01); *H05K 3/32* (2013.01); *H05K 2201/10204* (2013.01); *H05K 1/0269* (2013.01); *H05K 2201/09918* (2013.01)
USPC .......................................... 174/260; 361/761

(58) Field of Classification Search
CPC ..... H05K 1/0269; H05K 1/182; H05K 1/188; H05K 2201/09918; H05K 2201/10204; H05K 3/32
USPC .......... 174/257–266; 361/760–767; 29/25.03, 29/620, 830–834, 841, 846, 847, 851, 825
See application file for complete search history.

(56) References Cited

U.S. PATENT DOCUMENTS

| | | | | |
|---|---|---|---|---|
| 5,956,564 | A | * | 9/1999 | Newman et al. ................. 438/9 |
| 7,178,229 | B2 | * | 2/2007 | Borland et al. ................. 29/831 |
| 7,586,198 | B2 | * | 9/2009 | Borland et al. ............... 257/767 |
| 2014/0216801 | A1 | * | 8/2014 | Matsumoto et al. .......... 174/259 |

FOREIGN PATENT DOCUMENTS

| | | |
|---|---|---|
| JP | 3-53874 | 5/1991 |
| JP | 2005-159345 A | 6/2005 |
| JP | 2010-027917 A | 2/2010 |
| JP | 2010-087499 A | 4/2010 |

OTHER PUBLICATIONS

International Search Report for PCT/JP2010/067260, dated Dec. 7, 2010.
Written Opinion for PCT/JP2010/067260, dated Dec. 7, 2010.

* cited by examiner

*Primary Examiner* — Yuriy Semenenko
(74) *Attorney, Agent, or Firm* — Marshall, Gerstein & Borun LLP

(57) ABSTRACT

A component-embedded substrate includes an electrically insulating base (11) of resin, an electric or electronic embedded component (8) and a dummy embedded component (7) both embedded in the insulating base (11), a conductor pattern (18) formed on at least one side of the insulating base (11) and connected directly to or indirectly via a connection layer (6) to the embedded component (8) and the dummy embedded component (7), and a mark (10) formed on a surface of the dummy embedded component (7) and used as a reference when the conductor pattern (18) is formed, whereby positional accuracy of the conductor pattern (18) relative to the embedded component (8) can be improved.

7 Claims, 5 Drawing Sheets

COMPONENT-EMBEDDED SUBSTRATE, AND METHOD OF MANUFACTURING THE COMPONENT-EMBEDDED SUBSTRATE

TECHNICAL FIELD

The present invention relates to a component-embedded substrate with a conductor pattern formed with high accuracy, and a method of manufacturing such a component-embedded substrate.

BACKGROUND ART

There have been known component-embedded substrates having electric or electronic components embedded therein (see Patent Document 1, for example). A component-embedded substrate as typified by the one disclosed in Patent Document 1 is fabricated by laminating an electrically insulating base such as a prepreg on a component, and then partly removing an outside electrically conductive layer by etching or the like, to form a conductor pattern. When the pattern is to be formed, however, difficulty arises in aligning the pattern with the terminals of the component. Thus, using an electrically conductive substance such as copper, a mark is formed on a core substrate, which is an insulating base with a hole permitting the component to be inserted therein, and the core substrate is subjected to lamination along with the component. The buried mark is detected by means of X rays to form a through hole passing through the mark, and a conductor pattern is formed using the through hole as a reference, to improve the positional accuracy of the conductor pattern. However, forming a mark on the core substrate requires the same amount of labor as forming an ordinary conductor pattern, and also an additional process needs to be performed for that purpose.

There has also been known a method in which a hole is formed beforehand in an electrically conductive layer such as a copper foil, a solder resist is formed using the hole as a reference, X-ray hole cutting is performed following lamination by using the hole as a reference, a guide hole is formed using the X rays-cut hole as a reference, and a conductor pattern is formed using the guide hole as a reference, to improve positional accuracy. This method, however, involves multiple processes performed using different holes as reference positions, and actual positional accuracy is low. In practice, moreover, the resin of prepreg flows into the hole formed in the conductive layer, making it difficult to fabricate a satisfactory substrate.

PRIOR ART DOCUMENT

Patent Document

Patent Document 1: Japanese Laid-open Patent Publication No. 2010-27917

SUMMARY OF THE INVENTION

Problem to be Solved by the Invention

The present invention was created in view of the aforementioned conventional techniques, and an object thereof is to provide a component-embedded substrate whose conductor pattern can be formed with high positional accuracy relative to an embedded component without the need for complicated process, and a method of manufacturing the component-embedded substrate.

Means for Solving the Problem

To achieve the object, the present invention provides a component-embedded substrate comprising: an electrically insulating base made of resin; an electric or electronic embedded component and a dummy embedded component both embedded in the insulating base; a conductor pattern formed on at least one side of the insulating base and connected directly to or indirectly via a connection layer to the embedded component and the dummy embedded component; and a mark formed on a surface of the dummy embedded component and used as a reference when the conductor pattern is formed.

Preferably, the connection layer is made of solder.

Alternatively, the connection layer is preferably made of an adhesive.

Preferably, the mark is made of a metal (e.g., copper, nickel, solder, etc.) capable of being easily detected by X rays.

The dummy embedded component and the insulating base are preferably made of an identical material (e.g., epoxy resin etc.).

Preferably, the component-embedded substrate has a reference hole penetrating through the insulating base, the mark and the dummy embedded component.

The present invention also provides a method of manufacturing a component-embedded substrate, comprising: forming an electrically conductive layer, which is to form a conductor pattern, on a supporting plate; forming a connection layer on the supporting plate and the conductive layer; connecting an electric or electronic component to the conductive layer with the connection layer therebetween; connecting a dummy component having a mark affixed thereon to the supporting plate with the connection layer therebetween; embedding the component and the dummy component in an electrically insulating base of resin; and removing part of the conductive layer while using the mark as a reference, to form the conductor pattern.

Advantageous Effects of the Invention

According to the present invention, the component and the dummy component are mounted via the connection layer on the conductive layer forming the conductor pattern. The component and the dummy component are mounted directly or indirectly on the conductive layer with use of an identical mounter and, therefore, are positioned with identical accuracy. Accordingly, relative positional accuracy of the components can be enhanced. Also, the conductor pattern is formed using, as a reference position, the mark affixed on the dummy embedded component, and this makes it possible, in combination with the fact that the relative positional accuracy of the dummy embedded component and the embedded component is enhanced, to improve the positional accuracy of the conductor pattern relative to the embedded component. Further, the dummy component used for improving the positional accuracy can be mounted by the same process as that for mounting the component, as stated above. No complicated process is therefore required for improving the positional accuracy of the conductor pattern.

Where the connection layer is made of solder, it is possible to further enhance the positional accuracy of the embedded component and the dummy embedded component by making use of the self-alignment effect of solder.

Alternatively, the connection layer may be made of an adhesive, and the component and the dummy component may be mounted via the adhesive such that the electrodes of the component face the adhesive, whereby the electrode-side surface of the component can be positioned on a level with the corresponding surface of the dummy component. Since the mounting accuracy depends on the precision of the mounter used, relative positional accuracy of the components can be further enhanced. The dummy embedded component and the adhesive are indirectly connected with the mark therebetween, and in this case, by appropriately changing the thickness of the mark, it is possible to adjust the height of the dummy component so as to be on a level with the component.

Where a material capable of being easily detected by X rays is used as the material of the mark, the mark can be detected using an automatic aligner capable of identifying the mark on an X-ray image.

The dummy component and the insulating base may be made of an identical material. In this case, after the mark is detected and used as a reference position for forming the conductor pattern, the dummy embedded component itself can be used as the insulating base in the subsequent process, whereby processing efficiency is improved. Further, since the coefficient of thermal expansion of the dummy embedded component is identical with that of the insulating base, displacement between the mark and the dummy embedded component can be suppressed.

The reference hole is formed so that the conductor pattern can be formed using the reference hole as a reference. Since the conductor pattern can be formed with its positioning relative to the reference hole being visually checked, workability improves.

Also, according to the present invention, the dummy component may be connected to a region located in the same plane as, but set apart from, the conductive layer to which the component is connected. In this case, even if the substrate does not have sufficient space therein for mounting the dummy component, positional accuracy of the conductor pattern can be improved by using the mark on the dummy component as a reference position without embedding the dummy component in or near the product. Also in the manufacturing method of the present invention, since the positional accuracy of the components is determined by the precision of an identical mounter used to mount the components, relative positional accuracy of these components improves. Further, the conductor pattern is formed using, as a reference position, the mark affixed on the dummy embedded component, and this makes it possible, in combination with the fact that the relative positional accuracy of the dummy embedded component and the embedded component is enhanced, to improve the positional accuracy of the conductor pattern relative to the embedded component. In the manufacturing method, moreover, the dummy component used for improving the positional accuracy can be mounted by the same process as that for mounting the component. No complicated process is therefore required for improving the positional accuracy of the conductor pattern.

MODE FOR CARRYING OUT THE INVENTION

Figure 1:
FIG. 1 schematically illustrates a component-embedded substrate manufacturing process according to the present invention.
Figure 2:
FIG. 2 schematically illustrates a component-embedded substrate manufacturing process according to the present invention.
Figure 3:
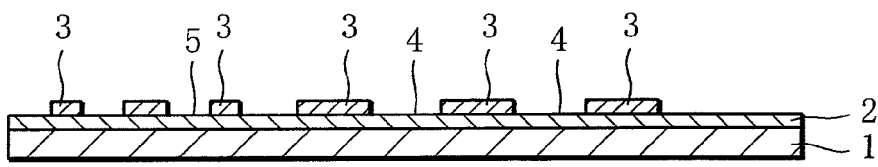
FIG. 3 schematically illustrates a component-embedded substrate manufacturing process according to the present invention.

As illustrated in FIG. 1, a supporting plate 1 is prepared first. The supporting plate 1 is, for example, a SUS plate. Then, as shown in FIG. 2, a thin electrically conductive layer 2 is formed over a surface of the supporting plate 1. The conductive layer 2 is formed, for example, by copper plating. Subsequently, a mask layer 3 is formed on the conductive layer 2, as shown in FIG. 3. The mask layer 3 is a solder resist, for example, and is formed such that predetermined portions of the conductive layer 2 are exposed. Some of the exposed regions serve as mounting spots 4 for mounting a component, and others of the exposed regions are used as dummy mounting spots 5 for mounting a dummy component. The positions of the mounting spots 4 and dummy mounting spots 5 are determined beforehand. Specifically, the positions of the mounting spots 4 are determined taking into account the positions of solder pads 6 (see FIG. 4) formed as a connection layer for mounting a component 8 (see FIG. 5) on the conductive layer 2 which is to form a conductor pattern 18 (see FIG. 8). The positions of the dummy mounting spots 5 are determined taking into account the position of a dummy component 7 (see FIG. 5) formed so as to improve the positional accuracy of the conductor pattern 18.

Figure 4:
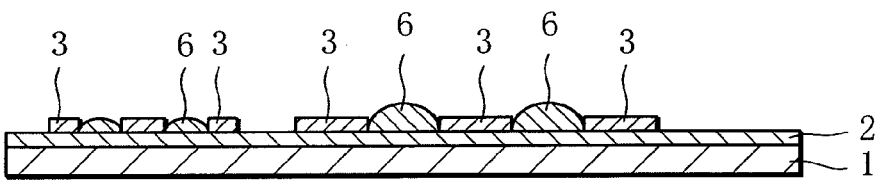
FIG. 4 schematically illustrates a component-embedded substrate manufacturing process according to the present invention.
Figure 5:
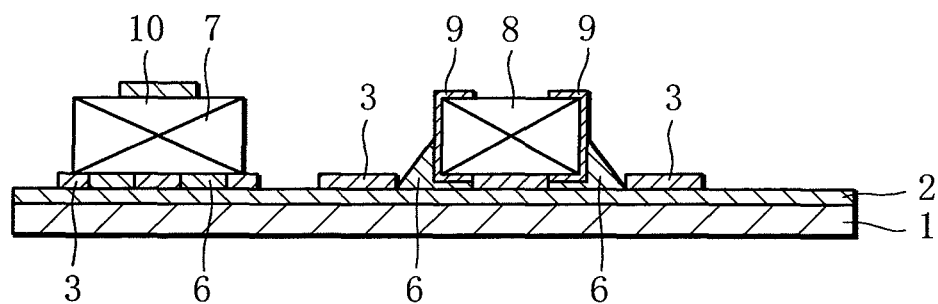
FIG. 5 schematically illustrates a component-embedded substrate manufacturing process according to the present invention.

Then, the solder pads 6 are formed as a connection layer on the mounting spots 4 and the dummy mounting spots 5, as illustrated in FIG. 4. Next, as shown in FIG. 5, an electric or electronic component 8 and a dummy component 7 are mounted on the conductive layer 2 or the mask layer 3. The component 8 is mounted with its connection terminals 9 connected to the respective solder pads 6, thereby achieving electrical connection between the component 8 and the conductive layer 2. The dummy component 7 is connected to the corresponding solder pads 6, whereby the conductive layer 2 and the dummy component 7 are connected to each other. The dummy component 7 is connected directly to or indirectly via the solder pads 6 or the mask layer 3 to the conductive layer 2. A mark 10, described later, is formed on a surface of the dummy component 7 (usually, on a connection surface where the dummy component 7 is connected to the conductive layer 2, though, in the figure, the mark 10 is arranged on that surface of the dummy component 7 which is located opposite the connection surface).

Subsequently, an electrically insulating base 11 and a core substrate 12 are prepared. The insulating base 11 and the core substrate 12 are each made of resin. The insulating base 11 is what is called a prepreg. The core substrate 12 has a through hole 14 into which the component 8 can be inserted. With the component 8 inserted into the through hole 14, the insulating base 11 and further an upper electrically conductive layer 22 are superposed, and the resulting structure is compressed.

Figure 6:
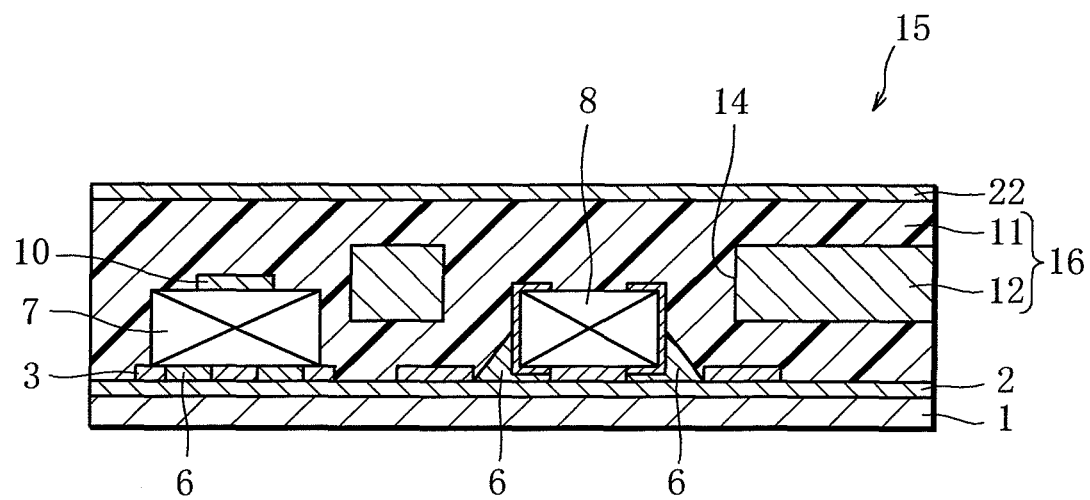
FIG. 6 schematically illustrates a component-embedded substrate manufacturing process according to the present invention.

As a result, a laminated body 15 is obtained as shown in FIG. 6, the laminated body 15 being a laminate of the supporting plate 1, the insulating base 11 and the core substrate 12. At this stage, the insulating base 11 is filled into the space of the through hole 14. Thus, the insulating base 11 and the core substrate 12 form an electrically insulating layer 16, and the component 8 is embedded in the insulating layer 16. Since the through hole 14 is formed in advance, it is possible to suppress the pressure applied to the component 8 during the lamination process. Also, the component 8, if large in size, can be satisfactorily embedded in the insulating layer 16. Although, in the above example, the core substrate 12 is used, prepreg (insulating base 11) alone may be used for the lamination as the case may be. In this case, the insulating layer 16 is formed in its entirety of the insulating base 11.

Because of the lamination, the dummy component 7 is also embedded in the insulating layer 16. The core substrate 12 may be provided with a through hole into which the dummy component 7 can be inserted, or the core substrate 12 may be placed so as not to apply pressure to the dummy component 7 as illustrated.

Figure 7:
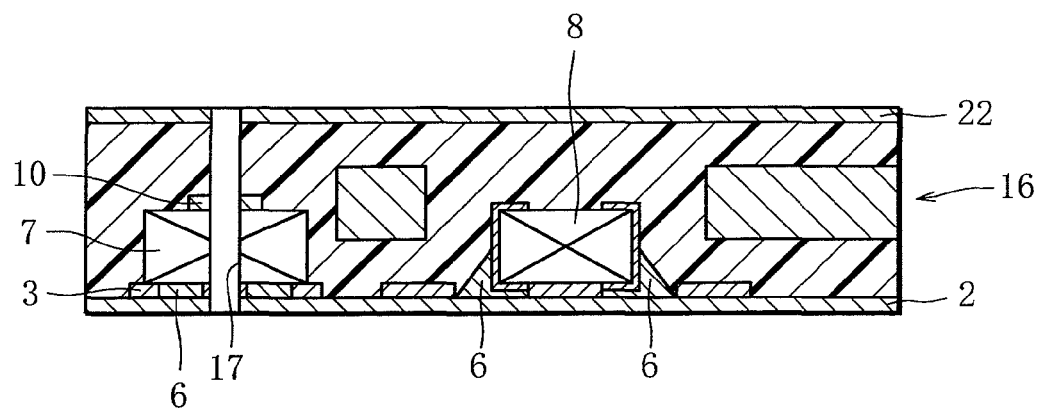
FIG. 7 schematically illustrates a component-embedded substrate manufacturing process according to the present invention.

Then, the supporting plate 1 is removed as shown in FIG. 7. Subsequently, the position of the dummy embedded component 7 is detected, and a reference hole 17 penetrating through the dummy embedded component 7 as well as the conductive layer 2 is formed. In FIG. 7, the reference hole 17 penetrates through the insulating layer 16 as well as the conductive layers 2 and 22 formed on the opposite surfaces of the insulating layer 16. The position of the dummy embedded component 7 is detected using an automatic aligner capable of identifying the mark 10 of copper on an X-ray image, such as an X-ray irradiation device (not shown). By using an X-ray irradiation device, it is possible to accurately detect the mark 10 and thus the position of the dummy embedded component 7. The material of the mark 10 is therefore not limited to copper and may be any material (e.g., nickel, solder, etc.) that can be easily detected by means of X rays. Instead of detecting the dummy embedded component 7 in the above manner, the conductive layer 2 may be scraped to expose the dummy embedded component 7 so that the mark 10 may be directly identified with use of a camera. Also, without embedding the dummy component 7 in the insulating layer 16, the mark 10 may be visually identified from outside.

Figure 8:
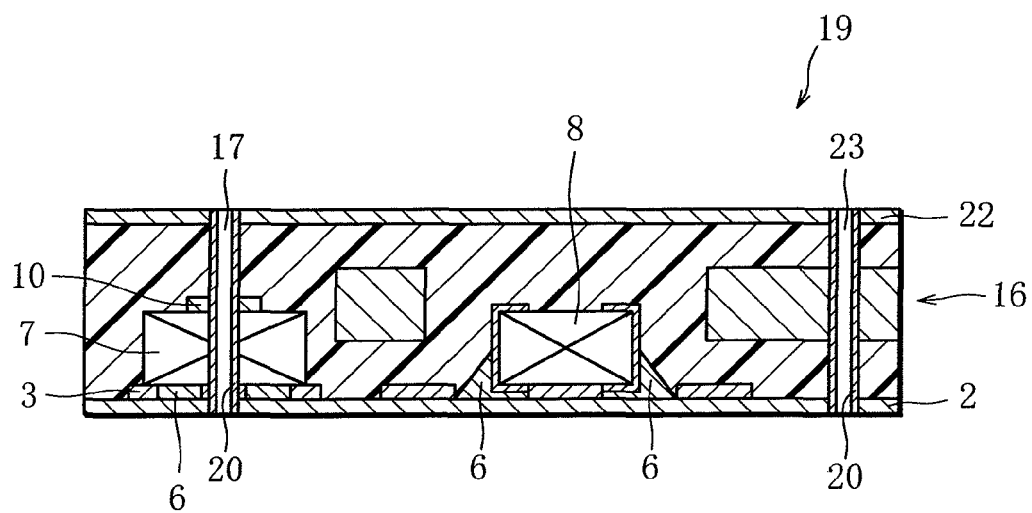
FIG. 8 schematically illustrates a component-embedded substrate manufacturing process according to the present invention.

Subsequently, as illustrated in FIG. 8, a through hole 23 is formed using the reference hole 17 as a reference position, and an electrically conductive coating 20 is formed on the inner surface of the through hole 23 by plating, thereby ensuring electrical conduction between the opposite sides of the insulating layer.

Figure 9:
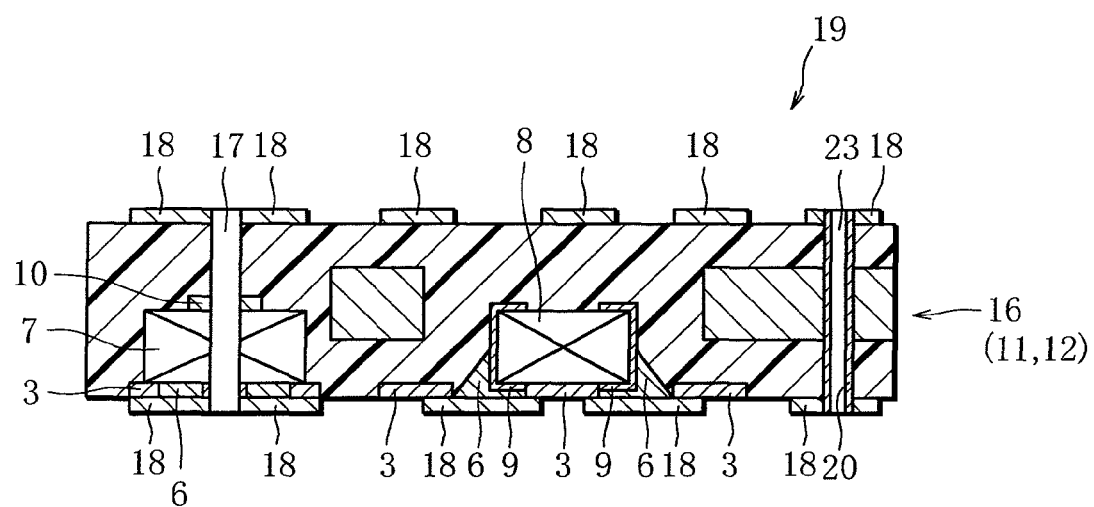
FIG. 9 schematically illustrates a component-embedded substrate according to the present invention.

Then, using the reference hole 17 as a reference position, the conductive layers 2 and 22 are partly removed by etching or the like, as shown in FIG. 9, to form conductor patterns 18. This completes the fabrication of a component-embedded substrate 19.

In the component-embedded substrate 19 fabricated in the aforementioned manner, the embedded component 8 and the dummy embedded component 7 are mounted via the solder pads 6 as a connection layer on the conductive layer 2 forming the conductor pattern 18. The component 8 and the dummy component 7 are mounted with use of an identical mounter and therefore, are positioned with identical accuracy. Accordingly, relative positional accuracy of the components 7 and 8 can be enhanced. Also, the conductor patterns 18 are formed using, as a reference position, the mark 10 affixed on the dummy embedded component 7, and this makes it possible, in combination with the fact that the relative positional accuracy of the dummy embedded component 7 and the embedded component 8 is enhanced, to improve the positional accuracy of the conductor patterns 18 relative to the embedded component 8. Further, the dummy component 7 used for improving the positional accuracy can be mounted by the same process as that for mounting the component 8, as stated above. No complicated process is therefore required for improving the positional accuracy of the conductor patterns 18.

Also, since the connection layer is constituted by the solder pads 6, it is possible to further enhance the positional accuracy of the embedded component 8 and the dummy embedded component 7 by making use of the self-alignment effect of the solder pads 6. Further, the mark 10 is made of copper and thus can be easily detected by means of X rays. The dummy component 7 may be made of a material (e.g., epoxy resin) identical with that of the insulating base 11. In this case, after the mark 10 is detected and used as a reference position for forming the conductor patterns 18, the dummy embedded component 7 itself can be used as the insulating base 11 in the subsequent process, whereby processing efficiency is improved. Further, since the coefficient of thermal expansion of the dummy embedded component 7 is identical with that of the insulating base 11, displacement between the mark 10 and the dummy embedded component 7 can be suppressed.

The reference hole 17 is formed so that the conductor patterns 18 can be formed using the reference hole 17 as a reference. Since the conductor patterns 18 can be formed with their positioning relative to the reference hole 17 being visually checked, workability improves.

Figure 10:
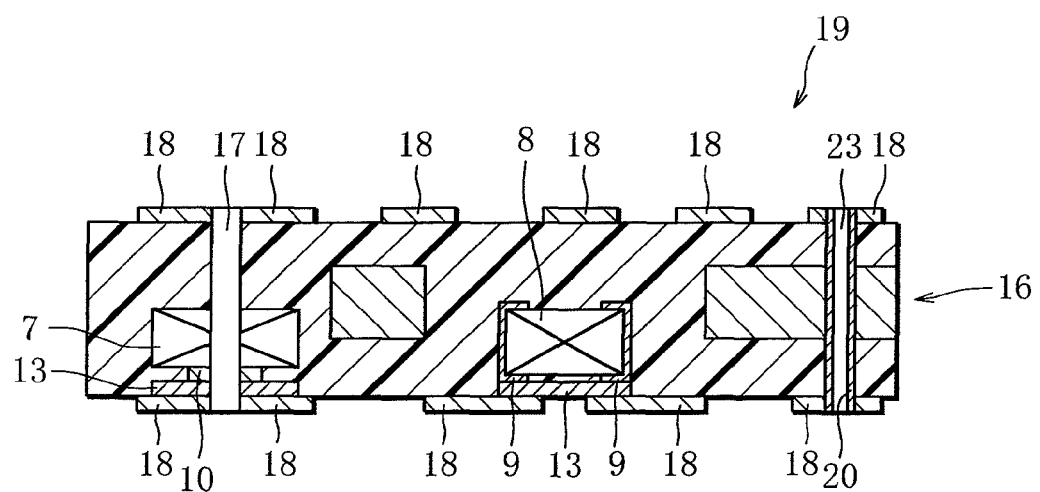
FIG. 10 schematically illustrates another component-embedded substrate according to the present invention.

Instead of using the solder 6 as the connection layer, adhesive 13 may be used as illustrated in FIG. 10. In the example of FIG. 10, the adhesive 13 is in direct contact with the mark 10 and the conductor pattern 18. This permits the mark 10 of the dummy component 7 to be located on a level with the component 8, and since the mounting accuracy depends on the precision of the mounter used, relative positional accuracy of the components 7 and 8 can be further enhanced.

Figure 11:
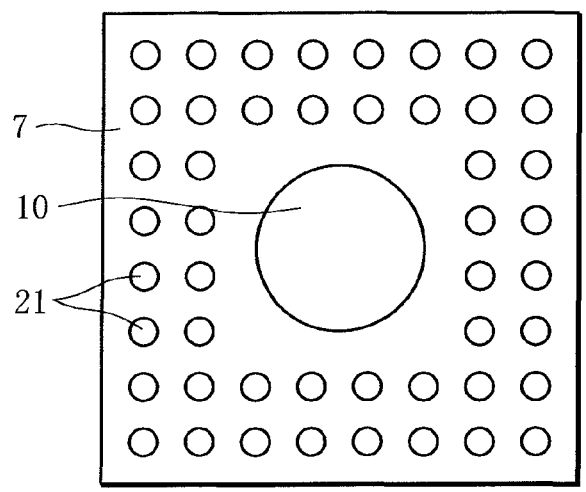
FIG. 11 exemplifies another dummy component and schematically illustrates a surface of the dummy component where the dummy component is mounted on a conductive layer.

In the foregoing example, the mark 10 is formed on that surface of the dummy embedded component 7 which is located opposite the connection surface where the component 7 is connected to the solder pads 6. Alternatively, the mark 10 may be formed on the connection surface where the dummy component 7 is connected to the solder pads 6, as illustrated in FIG. 11, and terminals (ball lands) 21 may be formed so as to surround the mark 10. The terminals 21 are connected to the solder pads 6. The formation of the ball lands 21 in the form of a grid as shown in FIG. 11 is preferred because self-alignment stability can be improved.

Figure 12:
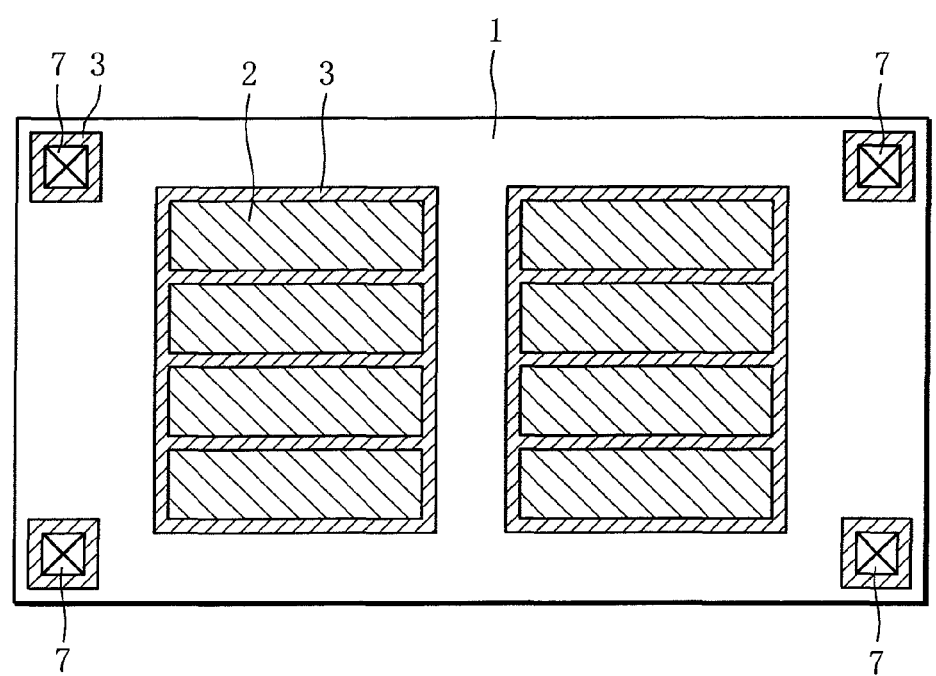
FIG. 12 schematically illustrates a component-embedded substrate manufacturing method according to the present invention.

Further, as illustrated in FIG. 12, dummy components 7 may be mounted on the supporting plate 1. In the aforementioned example of manufacturing procedure, the dummy components 7 are mounted on a portion of the supporting plate 1 located outside of the conductive layer 2, instead of mounting the dummy component 7 on the mask layer 3 formed on the conductive layer 2 as illustrated in FIG. 5. In this case, dummy mounting spots 5 may be defined by the mask layer 3, as in the example shown in FIG. 5. Then, using marks 10 on the dummy components 7 as reference positions, conductor patterns 18 are formed. With this configuration, even in the case where the substrate does not have sufficient space therein for mounting the dummy components 7, the positional accuracy of the conductor patterns 18 can be improved by using the marks 10 as reference positions without embedding the dummy components 7. The component-embedded substrate fabricated in this manner has the same advantages as those achieved by the aforementioned component-embedded substrate 19.

EXPLANATION OF REFERENCE SIGNS

1: supporting plate
2: conductive layer
3: mask layer
4: mounting spot
5: dummy mounting spot
6: solder pad
7: dummy embedded component
8: embedded component
9: connection terminal
10: mark
11: insulating base
12: core substrate
13: adhesive
14: through hole
15: laminated body
16: insulating layer
17: reference hole
18: conductor pattern
19: component-embedded substrate
20: conductive coating
21: terminal

The invention claimed is:

1. A component-embedded substrate comprising:
    an electrically insulating base made of resin;
    an electric or electronic embedded component and a dummy embedded component both embedded in the insulating base;
    a conductor pattern formed on at least one side of the insulating base and connected directly to or indirectly via a connection layer to the embedded component and the dummy embedded component; and
    a mark formed on a surface of the dummy embedded component and used as a reference when the conductor pattern is formed.

2. The component-embedded substrate according to claim 1, wherein the connection layer is made of solder.

3. The component-embedded substrate according to claim 1, wherein the connection layer is made of an adhesive, and the adhesive and the dummy embedded component are indirectly connected to each other with the mark therebetween.

4. The component-embedded substrate according to claim 1, wherein the mark is made of a metal capable of being easily detected by X rays.

5. The component-embedded substrate according to claim 1, wherein the dummy embedded component and the insulating base are made of an identical material.

6. The component-embedded substrate according to claim 1, wherein the component-embedded substrate has a reference hole penetrating through the insulating base, the mark and the dummy embedded component.

7. A method of manufacturing a component-embedded substrate, comprising:
    forming an electrically conductive layer, which is to form a conductor pattern, on a supporting plate;
    forming a connection layer on the supporting plate and the conductive layer;
    connecting an electric or electronic component to the conductive layer with the connection layer therebetween;
    connecting a dummy component having a mark affixed thereon to the supporting plate with the connection layer therebetween;
    embedding the component and the dummy component in an electrically insulating base of resin; and
    removing part of the conductive layer while using the mark as a reference, to form the conductor pattern.

* * * * *